(12) United States Patent
Hsieh et al.

(10) Patent No.: US 10,629,537 B2
(45) Date of Patent: Apr. 21, 2020

(54) CONDUCTIVE VIAS IN SEMICONDUCTOR PACKAGES AND METHODS OF FORMING SAME

(71) Applicant: Taiwan Semiconductor Manufacturing Company, Ltd., Hsinchu (TW)

(72) Inventors: Cheng-Hsien Hsieh, Kaohsiung (TW); Li-Han Hsu, Hsinchu (TW); Wei-Cheng Wu, Hsinchu (TW); Hsien-Wei Chen, Hsinchu (TW); Der-Chyang Yeh, Hsinchu (TW); Chi-Hsi Wu, Hsinchu (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/206,850

(22) Filed: Nov. 30, 2018

(65) Prior Publication Data

US 2019/0115299 A1 Apr. 18, 2019

Related U.S. Application Data

(62) Division of application No. 15/725,642, filed on Oct. 5, 2017, now Pat. No. 10,290,584.

(Continued)

(51) Int. Cl.
*H01L 23/538* (2006.01)
*H01L 23/14* (2006.01)
(Continued)

(52) U.S. Cl.
CPC ........ *H01L 23/5384* (2013.01); *H01L 21/306* (2013.01); *H01L 21/486* (2013.01);
(Continued)

(58) Field of Classification Search
CPC ......... H01L 21/76816; H01L 21/76802; H01L 24/03
See application file for complete search history.

(56) References Cited

U.S. PATENT DOCUMENTS 6,472,763 B2 * 10/2002 Fukuda ................... H01L 24/10
257/772
6,909,188 B2 6/2005 Akiyama
(Continued)

FOREIGN PATENT DOCUMENTS

CN 106206511 A 12/2016
CN 106558559 A 4/2017
(Continued)

*Primary Examiner* — David A Zarneke
(74) *Attorney, Agent, or Firm* — Slater Matsil, LLP

(57) ABSTRACT

An embodiment package includes a first integrated circuit die encapsulated in a first encapsulant; a first through via extending through the first encapsulant; and a conductive pad disposed in a dielectric layer over the first through via and the first encapsulant. The conductive pad comprises a first region electrically connected to the first through via and having an outer perimeter encircling an outer perimeter of the first through via in a top down view. The package further includes a first dielectric region extending through the first region of the conductive pad. A conductive material of the first region encircles the first dielectric region in the top down view.

20 Claims, 21 Drawing Sheets

Related U.S. Application Data

(60) Provisional application No. 62/513,281, filed on May 31, 2017.

(51) Int. Cl.

| | |
|---|---|
| *H01L 23/532* | (2006.01) |
| *H01L 23/495* | (2006.01) |
| *H01L 23/00* | (2006.01) |
| *H01L 21/48* | (2006.01) |
| *H01L 21/306* | (2006.01) |
| *H01L 23/498* | (2006.01) |
| *H01L 25/10* | (2006.01) |
| *H01L 21/56* | (2006.01) |
| *H01L 21/683* | (2006.01) |
| *H01L 23/522* | (2006.01) |
| *H01L 23/528* | (2006.01) |
| *H01L 21/768* | (2006.01) |
| *H01L 25/065* | (2006.01) |
| *H01L 23/31* | (2006.01) |
| *H01L 25/00* | (2006.01) |

(52) U.S. Cl.
CPC ........ *H01L 21/561* (2013.01); *H01L 21/6835* (2013.01); *H01L 23/147* (2013.01); *H01L 23/49575* (2013.01); *H01L 23/49816* (2013.01); *H01L 23/5389* (2013.01); *H01L 23/53238* (2013.01); *H01L 24/19* (2013.01); *H01L 24/20* (2013.01); *H01L 24/32* (2013.01); *H01L 24/83* (2013.01); *H01L 24/97* (2013.01); *H01L 25/105* (2013.01); *H01L 21/568* (2013.01); *H01L 21/76816* (2013.01); *H01L 21/76895* (2013.01); *H01L 23/3121* (2013.01); *H01L 23/3128* (2013.01); *H01L 23/49827* (2013.01); *H01L 23/528* (2013.01); *H01L 23/5226* (2013.01); *H01L 23/5283* (2013.01); *H01L 24/03* (2013.01); *H01L 24/04* (2013.01); *H01L 24/29* (2013.01); *H01L 24/48* (2013.01); *H01L 24/73* (2013.01); *H01L 25/0657* (2013.01); *H01L 25/50* (2013.01); *H01L 2221/68345* (2013.01); *H01L 2221/68359* (2013.01); *H01L 2221/68372* (2013.01); *H01L 2221/68381* (2013.01); *H01L 2224/04105* (2013.01); *H01L 2224/12105* (2013.01); *H01L 2224/16227* (2013.01); *H01L 2224/18* (2013.01); *H01L 2224/2919* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/82345* (2013.01); *H01L 2224/82365* (2013.01); *H01L 2224/82385* (2013.01); *H01L 2224/92244* (2013.01); *H01L 2224/97* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/15311* (2013.01); *H01L 2924/181* (2013.01); *H01L 2924/18162* (2013.01); *H01L 2924/3512* (2013.01); *H01L 2924/37001* (2013.01)

(56) References Cited

U.S. PATENT DOCUMENTS

| | | | |
|---|---|---|---|
| 8,652,855 B2 | 2/2014 | Summerfelt et al. | |
| 8,802,504 B1 | 8/2014 | Hou et al. | |
| 8,803,292 B2 | 8/2014 | Chen et al. | |
| 8,803,316 B2 | 8/2014 | Lin et al. | |
| 8,993,380 B2 | 3/2015 | Hou et al. | |
| 9,040,316 B1* | 5/2015 | Scanlan | H01L 21/76879 438/15 |
| 9,281,254 B2 | 3/2016 | Yu et al. | |
| 9,299,649 B2 | 3/2016 | Chiu et al. | |
| 9,496,189 B2 | 3/2016 | Yu et al. | |
| 9,372,206 B2 | 6/2016 | Wu et al. | |
| 9,385,076 B2* | 7/2016 | Chen | H01L 23/49838 |
| 9,425,126 B2 | 8/2016 | Kuo et al. | |
| 9,443,783 B2 | 9/2016 | Lin et al. | |
| 9,484,299 B2 | 11/2016 | Wang et al. | |
| 9,818,645 B2 | 11/2017 | Aoyagi et al. | |
| 10,068,844 B2 | 9/2018 | Chiu et al. | |
| 10,121,070 B2* | 11/2018 | Derenne | G06F 16/78 |
| 10,170,432 B2 | 1/2019 | Lin et al. | |
| 10,199,341 B2 | 2/2019 | Liang et al. | |
| 10,211,070 B2 | 2/2019 | Lee et al. | |
| 2006/0284310 A1* | 12/2006 | Hall | H01L 23/49827 257/734 |
| 2013/0037950 A1 | 2/2013 | Yu et al. | |
| 2016/0351494 A1 | 12/2016 | Chen et al. | |
| 2017/0092604 A1 | 3/2017 | Hsieh et al. | |
| 2017/0098640 A1 | 4/2017 | Liang et al. | |
| 2017/0125346 A1 | 5/2017 | Liu et al. | |
| 2017/0133309 A1 | 5/2017 | Kim et al. | |

FOREIGN PATENT DOCUMENTS

| | | |
|---|---|---|
| CN | 106653628 A | 5/2017 |
| TW | 201026189 A | 7/2010 |
| TW | 201308568 A | 2/2013 |

* cited by examiner

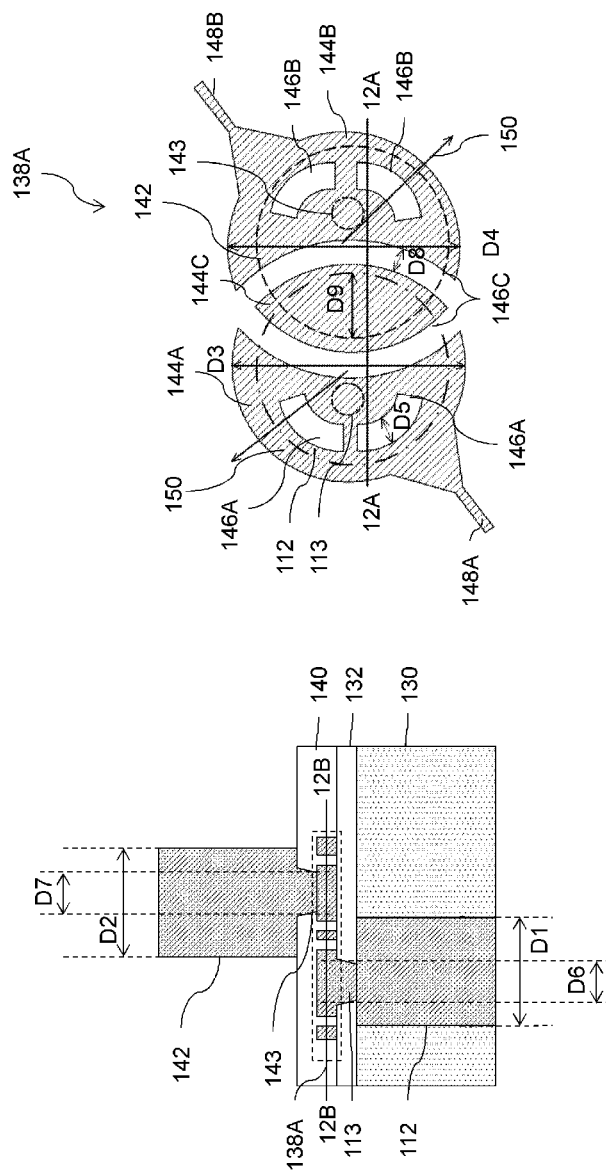

CONDUCTIVE VIAS IN SEMICONDUCTOR PACKAGES AND METHODS OF FORMING SAME

PRIORITY CLAIM

This application is a divisional of U.S. application Ser. No. 15/725,642, filed on Oct. 5, 2017, which claims the benefit of U.S. Provisional Application No. 62/513,281, filed on May 31, 2017, which applications are hereby incorporated herein by reference

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 11, 12A, 12B, 12C, 12D, and 13-18 illustrate cross-sectional and top-down views of various intermediary stages of manufacturing a semiconductor device package in accordance with some embodiments.

DETAILED DESCRIPTION

Figure 1:
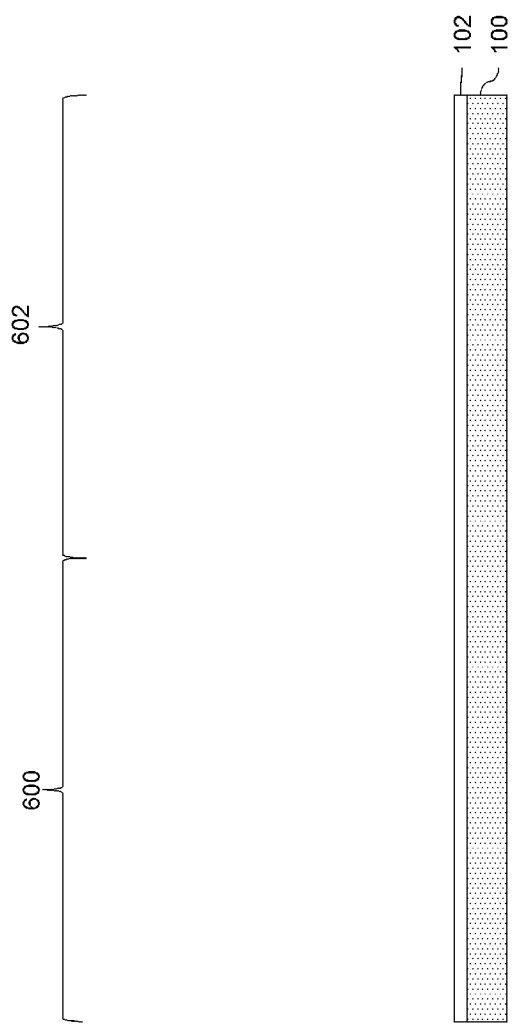

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Method embodiments discussed herein may be discussed as being performed in a particular order; however, other method embodiments may be performed in any logical order.

Embodiments discussed herein may be discussed in a specific context, namely a package structure having at least two levels of encapsulated semiconductor dies. Through vias extend through an encapsulant encapsulating the semiconductor dies at each level. A redistribution structure (e.g., comprising conductive lines in one or more insulating layers) are disposed between the levels of encapsulated semiconductor dies.

In some embodiments, the through vias of each level may be oriented so that their locations overlap in a top-down view. A conductive pad is disposed in the redistribution structure between overlapping through vias in order to provide electrical routing to/from the overlapping through vias, to reduce interference between overlapping the through vias, and/or to reduce stress between the overlapping through vias. For example, a conductive pad may be connected to a first through via in a first level (e.g., disposed under the conductive pad) and a second through via in a second level (e.g., disposed over the conductive pad). The conductive pad may electrically isolate or electrically connect the first through via and the second through via.

In some embodiments, the conductive pad is patterned to include openings in a conductive material of the conductive pad. For example, the openings may be filled with an insulating material of the redistribution structure. By reducing the overall density of conductive material (e.g., lower metal density) of the conductive pad, stress caused by the conductive pad itself may be advantageously reduced. Without being bound by a particular theory and as described in greater detail below, reduced metal density of the conductive pad may reduce manufacturing defects such as stress-induced sidewall peeling, thermal cycle test failure, and the like.

FIGS. 1 through 18 illustrate cross-sectional views of intermediate steps during a process for forming a first package component in accordance with some embodiments. FIG. 1 illustrates a carrier substrate 100 and a release layer 102 formed on the carrier substrate 100. A first package region 600 and a second package region 602 for the formation of a first package and a second package, respectively, are illustrated.

The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of coplanarity.

Figure 2:
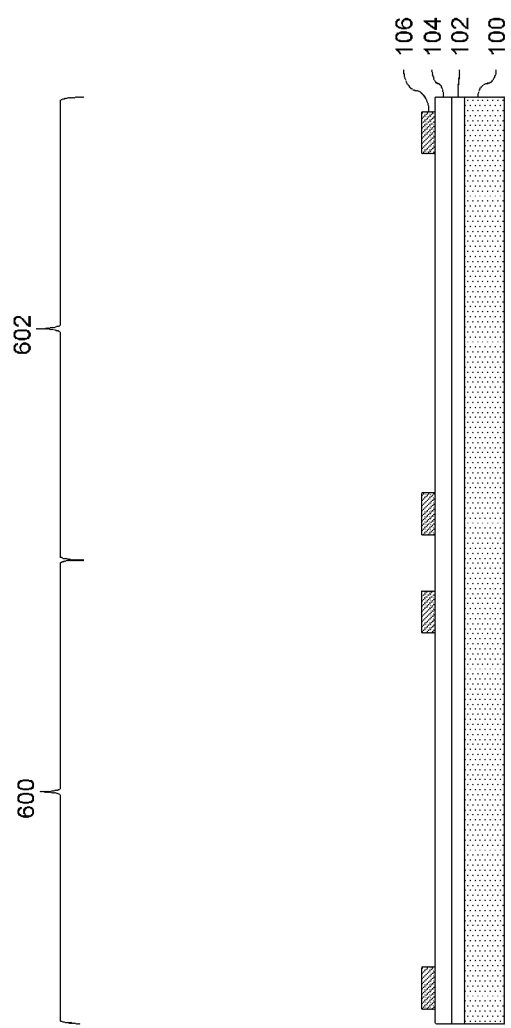

In FIG. 2, a dielectric layer 104 and a metallization pattern 106 (sometimes referred to as a redistribution layer 106 or redistribution line 106) are formed. As illustrated in FIG. 2, a dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, chemical vapor deposition (CVD), laminating, the like, or a combination thereof.

The metallization pattern 106 is formed on the dielectric layer 104. As an example to form metallization pattern 106, a seed layer (not shown) is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 106. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 106.

Figure 3:
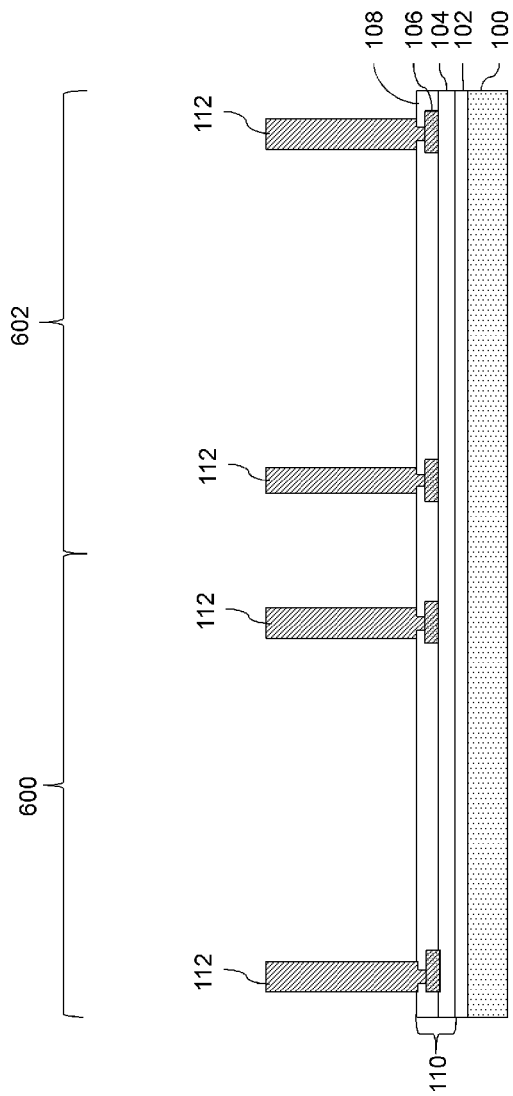

In FIG. 3, a dielectric layer 108 is formed on the metallization pattern 106 and the dielectric layer 104. In some embodiments, the dielectric layer 108 is formed of a polymer, which may be a photo-sensitive material such as PBO, polyimide, BCB, or the like, that may be patterned using a lithography mask. In other embodiments, the dielectric layer 108 is formed of a nitride such as silicon nitride; an oxide such as silicon oxide, PSG, BSG, BPSG; or the like. The dielectric layer 108 may be formed by spin coating, lamination, CVD, the like, or a combination thereof. The dielectric layer 108 is then patterned to form openings to expose portions of the metallization pattern 106. The patterning may be by an acceptable process, such as by exposing the dielectric layer 108 to light when the dielectric layer is a photo-sensitive material or by etching using, for example, an anisotropic etch.

The dielectric layers 104 and 108 and the metallization patterns 106 may be referred to as a redistribution structure 110. As illustrated, the redistribution structure 110 includes the two dielectric layers 104 and 108 and one metallization pattern 106. In other embodiments, the redistribution structure 110 can include any number of dielectric layers, metallization patterns, and vias. One or more additional metallization pattern and dielectric layer may be formed in the redistribution structure 110 by repeating the processes for forming a metallization patterns 106 and dielectric layer 108. Vias may be formed during the formation of a metallization pattern by forming the seed layer and conductive material of the metallization pattern in the opening of the underlying dielectric layer. The vias may therefore interconnect and electrically couple the various metallization patterns.

Further in FIG. 3, through vias 112 are formed. As an example to form the through vias 112, a seed layer is formed over the back-side redistribution structure 110, e.g., the dielectric layer 108 and the exposed portions of the metallization pattern 106 as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form through vias 112.

Figure 4:
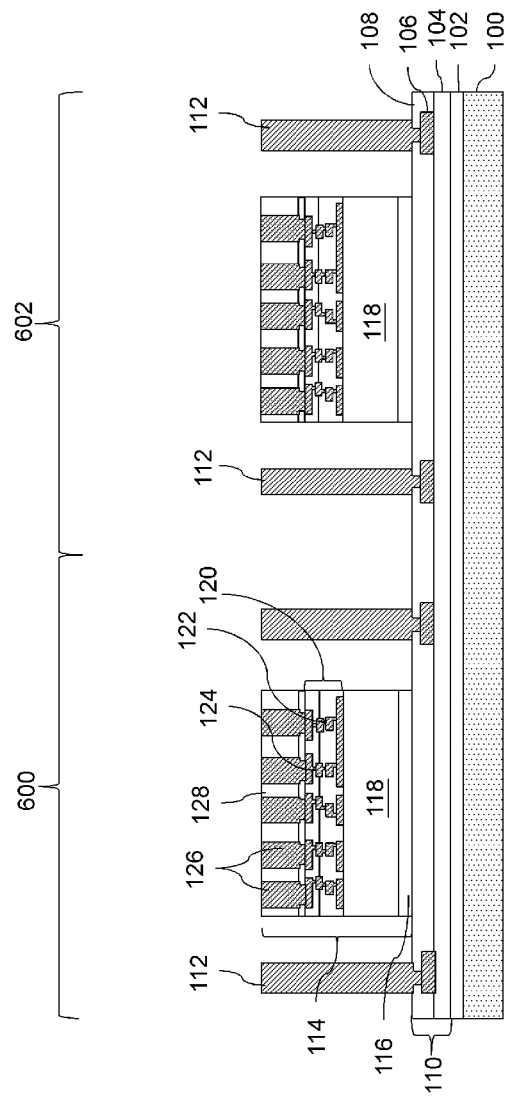

In FIG. 4, integrated circuit dies 114 are adhered to the dielectric layer 108 by an adhesive 116. As illustrated in FIG. 4, one integrated circuit die 114 is adhered in each of the first package region 600 and the second package region 602. In other embodiments, multiple integrated circuit dies 114 may be adhered in each region. The integrated circuit dies 114 may be bare dies, such as, logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 114 may be different sizes (e.g., different heights and/or surface areas), and in other embodiments, the integrated circuit dies 114 may be the same size (e.g., same heights and/or surface areas).

Before being adhered to the dielectric layer 108, the integrated circuit dies 114 may be processed according to applicable manufacturing processes to form integrated circuits in the integrated circuit dies 114. For example, the integrated circuit dies 114 each include a semiconductor substrate 118, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114 further comprise pads 122, such as aluminum pads, to which external connections are made. The pads 122 are on what may be referred to as respective active sides of the integrated circuit dies 114. Passivation films 124 are on the integrated circuit dies 114 and on portions of the pads 122. Openings are through the passivation films 124 to the pads 122. Die connectors 126, such as conductive pillars (for example, comprising a metal such as copper), are in the openings through the passivation films 124 and are mechanically and electrically coupled to the respective pads 122. The die connectors 126 may be formed by, for example, plating, or the like. The die connectors 126 electrically couple the respective integrated circuits of the integrate circuit dies 114.

A dielectric material 128 is on the active sides of the integrated circuit dies 114, such as on the passivation films 124 and the die connectors 126. The dielectric material 128 laterally encapsulates the die connectors 126, and the dielectric material 128 is laterally coterminous with the respective integrated circuit dies 114. The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

Adhesive 116 is on back-sides of the integrated circuit dies 114 and adheres the integrated circuit dies 114 to the back-side redistribution structure 110, such as the dielectric layer 108 in the illustration. The adhesive 116 may be any suitable adhesive, epoxy, die attach film (DAF), or the like. The adhesive 116 may be applied to a back-side of the integrated circuit dies 114, such as to a back-side of the respective semiconductor wafer or may be applied over the surface of the carrier substrate 100. The integrated circuit dies 114 may be singulated, such as by sawing or dicing, and adhered to the dielectric layer 108 by the adhesive 116 using, for example, a pick-and-place tool.

Integrated circuit dies 114 are illustrated and described above as being bare dies (e.g., unpackaged dies). In other embodiments, dies 114 may be packaged chips (e.g., one or more bare dies integrated with other package features, such as, redistribution structures, passive devices, etc.). For example, dies 114 may be a memory package (e.g., a hybrid memory cube) comprising a plurality of stacked and interconnected memory dies.

Figure 5:
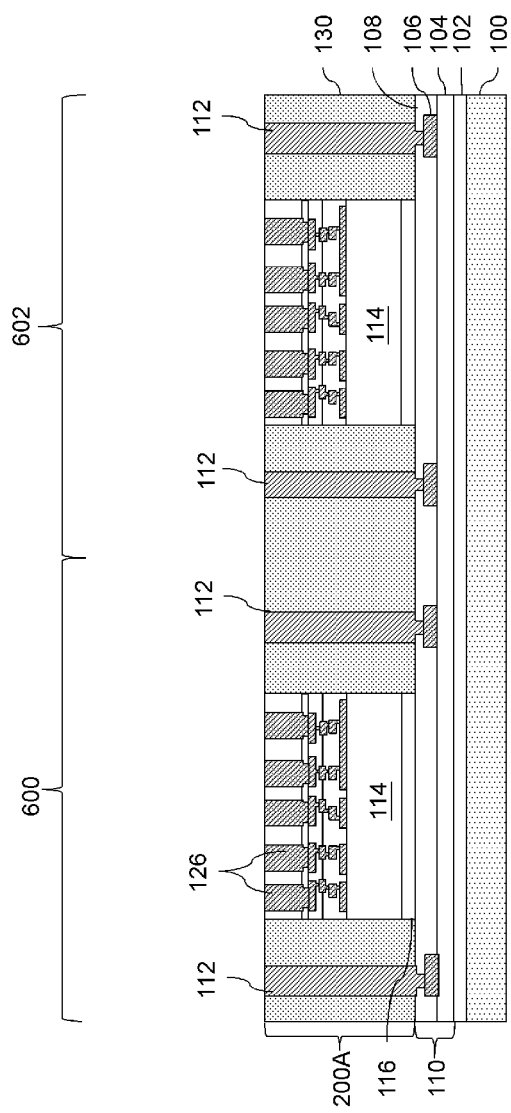

In FIG. 5, an encapsulant 130 is formed on the various components. The encapsulant 130 may be a molding compound, epoxy, or the like, and may be applied by compression molding, transfer molding, or the like. After curing, the encapsulant 130 can undergo a grinding process to expose the through vias 112 and die connectors 126. Top surfaces of the through vias 112, die connectors 126, and encapsulant 130 are coplanar after the grinding process. In some embodiments, the grinding may be omitted, for example, if through vias 112 and die connectors 126 are already exposed. The integrated circuit dies 114 encapsulated in encapsulant 130 and the through vias 112 extending through the encapsulant 130 forms a level 200A (sometimes referred to as tier 200A) of a semiconductor package (e.g., semiconductor package 200, see FIG. 18).

In FIGS. 6 through 10, a redistribution structure 141 (see FIG. 10) is formed. As will be illustrated in FIG. 10, the redistribution structure 141 includes dielectric layers 132 and 140 and metallization pattern 138 (sometimes referred to as redistribution layer 138 or redistribution lines 138).

Figure 6:
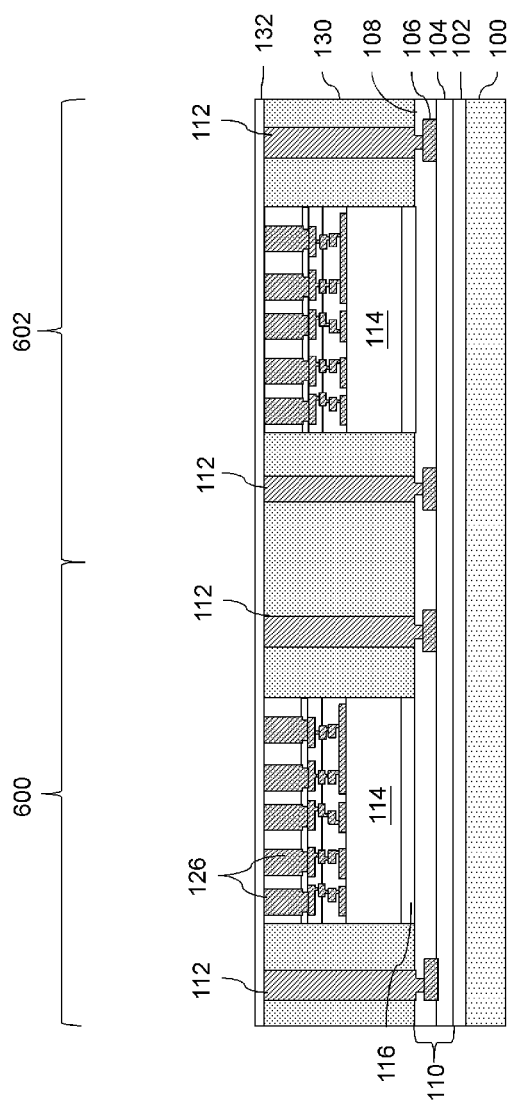

In FIG. 6, the dielectric layer 132 is deposited on the encapsulant 130, through vias 112, and die connectors 126. In some embodiments, the dielectric layer 132 is formed of a polymer, which may be a photo-sensitive material such as PBO, polyimide, BCB, or the like, that may be patterned using a lithography mask. In other embodiments, the dielectric layer 132 is formed of a nitride such as silicon nitride; an oxide such as silicon oxide, PSG, BSG, BPSG; or the like. The dielectric layer 132 may be formed by spin coating, lamination, CVD, the like, or a combination thereof.

Figure 7:
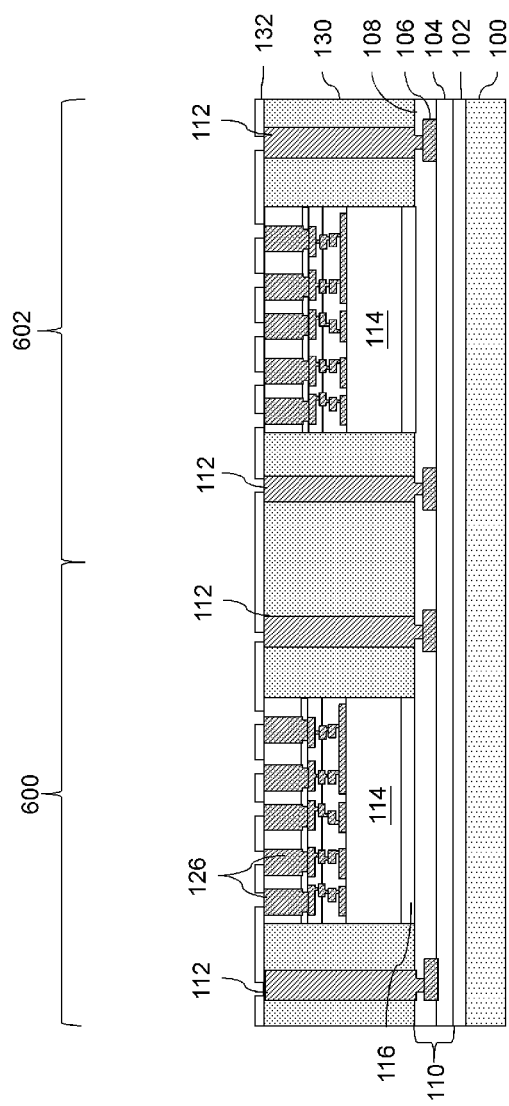

In FIG. 7, the dielectric layer 132 is then patterned. The patterning forms openings to expose portions of the through vias 112 and the die connectors 126. The patterning may be by an acceptable process, such as by exposing the dielectric layer 132 to light when the dielectric layer 132 is a photo-sensitive material or by etching using, for example, an anisotropic etch. If the dielectric layer 132 is a photo-sensitive material, the dielectric layer 132 can be developed after the exposure.

Figure 8:
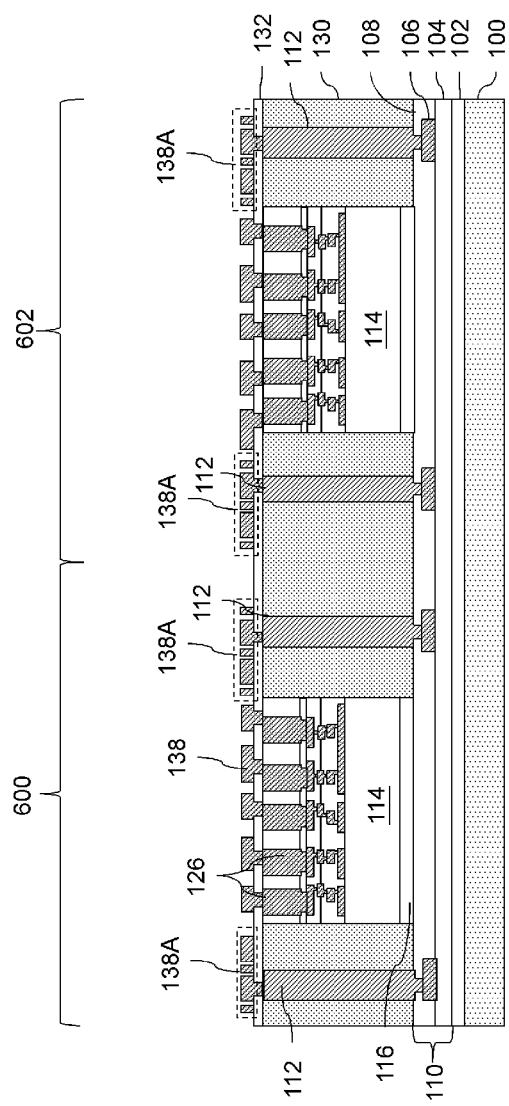

In FIG. 8, metallization pattern 138 with vias is formed on the dielectric layer 132. As an example to form metallization pattern 138, a seed layer (not shown) is formed over the dielectric layer 132 and in openings through the dielectric layer 132. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 138. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 138 and vias. The vias are formed in openings through the dielectric layer 132 to, e.g., the through vias 112 and/or the die connectors 126.

The metallization pattern 138 includes conductive pads 138A, which are electrically connected to through vias 112 by vias 113 extending through the dielectric layer 132. Each conductive pad 138A is connected to a respective through via 112 formed under the conductive pad 138A, and each conductive pad 138A is subsequently connected to a respective through via 142 (see FIGS. 11 and 12A) formed over the conductive pad 138A. The shape of conductive pads 138A will be described in greater detail with respect to FIG. 12A through 12D, and the shape of the conductive pads 138A may advantageously reduce stress and manufacturing defects. For example, openings may extend through the conductive pads 138A in order to reduce the material density (e.g., metal density) of the conductive pads 138A in order to reduce stress generated by the conductive pads 138A on subsequently formed package features (e.g., dielectric layer 140, see FIG. 9).

Figure 9:
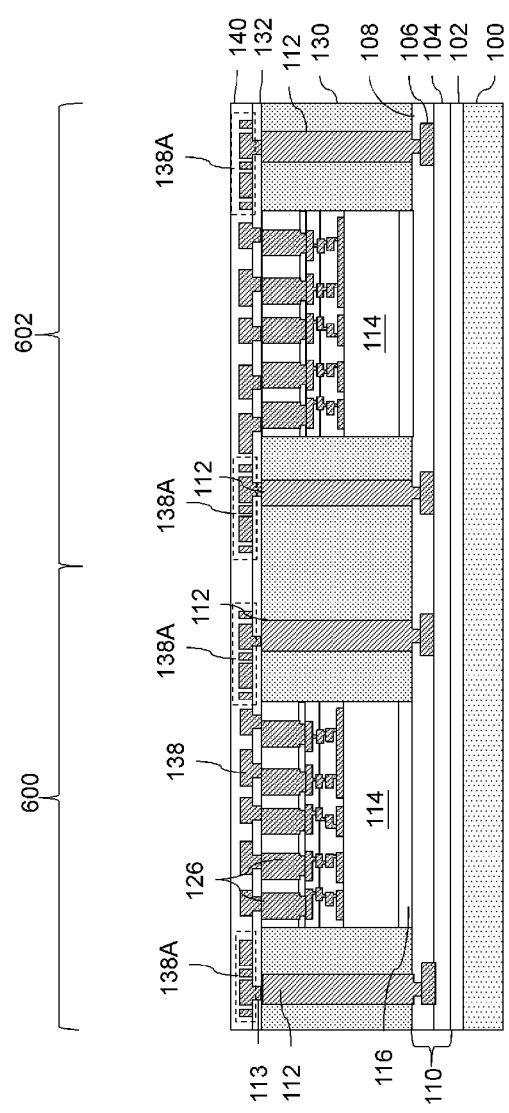

In FIG. 9, a dielectric layer 140 is deposited on the metallization pattern 138 and the dielectric layer 132. The dielectric layer 140 may be deposited to fill openings in the conductive pads 138A. In some embodiments, the dielectric layer 140 is formed of a polymer, which may be a photo-sensitive material such as PBO, polyimide, BCB, or the like, that may be patterned using a lithography mask. In other embodiments, the dielectric layer 140 is formed of a nitride such as silicon nitride; an oxide such as silicon oxide, PSG, BSG, BPSG; or the like. The dielectric layer 140 may be formed by spin coating, lamination, CVD, the like, or a combination thereof.

Figure 10:
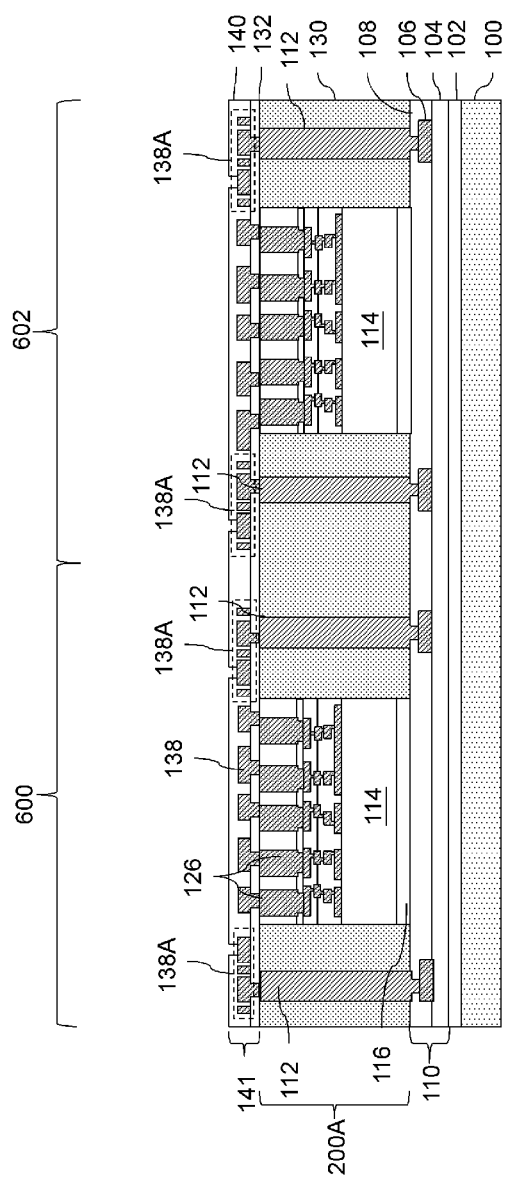

In FIG. 10, the dielectric layer 140 is then patterned. The patterning forms openings to expose portions of the metallization pattern 138 (including portions of the conductive pads 138A). The patterning may be by an acceptable process, such as by exposing the dielectric layer 140 to light when the dielectric layer is a photo-sensitive material or by etching using, for example, an anisotropic etch. If the dielectric layer 140 is a photo-sensitive material, the dielectric layer 140 can be developed after the exposure.

Thus, a redistribution structure 141 is formed over the level 200A (including integrated circuit dies 114 and through vias 112). Redistribution structure 141 is illustrated as including two dielectric layers 132 and 140 and one metallization pattern 138. In other embodiments, redistribution structure 141 may include a different number of dielectric layers (e.g., more than two) and/or metallization patterns (e.g., addition metallization patterns formed over the metallization pattern 138).

Figure 11:
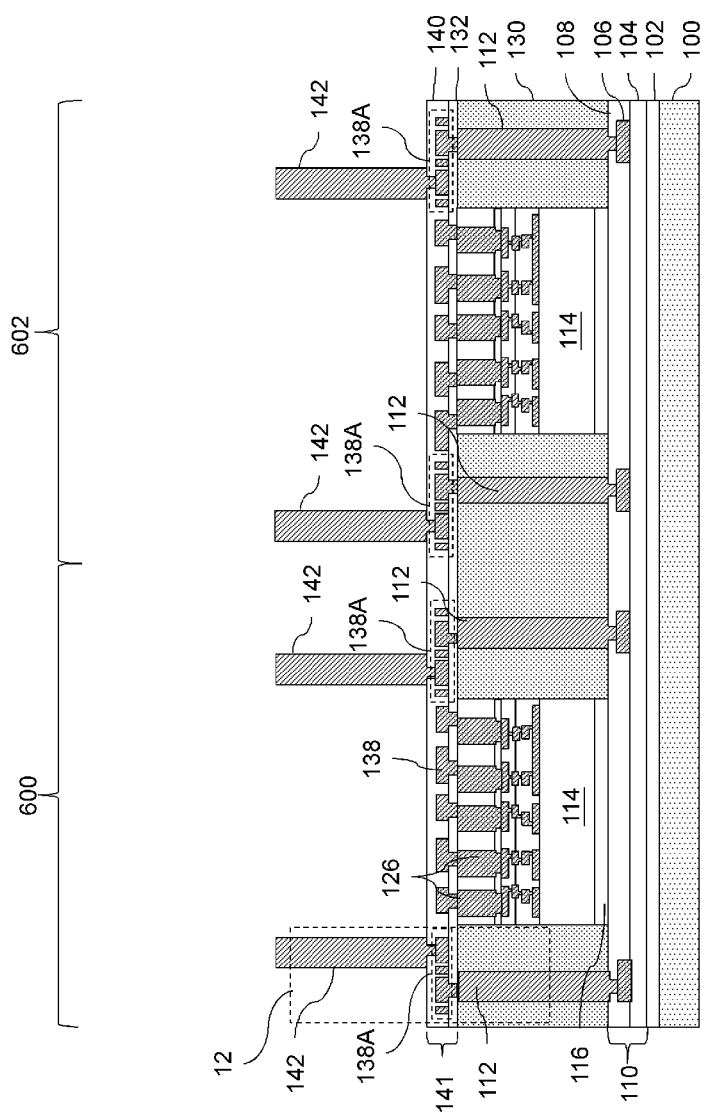

In FIG. 11, through vias 142 are formed. As an example to form the through vias 142, a seed layer is formed over the redistribution structure 141, e.g., the dielectric layer 140 and the exposed portions of the metallization pattern 138 (e.g., exposed portions of the conductive pads 138A) as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form through vias 142.

Each through via 142 is connected to a respective conductive pad 138A, which is also connected to a through via 112 in level 200A. FIGS. 12A and 12B illustrate a more detailed view of the configuration of a through via 112, a through via 142, and a conductive pad 138A. Specifically, FIG. 12A illustrates a detailed, cross-sectional view of features within box 12 of FIG. 11. FIG. 12B illustrates a top-down view of the conductive pad 138A taken along line 12B-12B of FIG. 12A. The cross-sectional view of FIG. 12A is taken along line 12A-12A of FIG. 12B As illustrated by FIG. 12A, the through via 112 is connected to the conductive pad 138A by a via 113 extending through the dielectric layer 132, and the through via 142 is connected to the conductive pad 138A by a via 143 extending from a top surface of the dielectric layer 140 to the conductive pad 138A. In a top-down view (see FIG. 12B), the through via 112, the through via 142, the via 113, and the via 143 may have a round (e.g., substantially circular) shape. Other shapes are also contemplated. A cross-sectional width of the through via 112 is denoted as distance D1 (see FIG. 12A), which corresponds to a diameter of the through via 112 in a top-down view (see FIG. 12B). In some embodiments, distance D1 is in the range of about 170 µm to about 210 µm. A cross-sectional width of the through via 142 is denoted as distance D2 (see FIG. 12A), which corresponds to a diameter of the through via 142 in a top-down view (see FIG. 12B). In some embodiments, distance D2 is in the range of about 100 µm to about 160 µm. A cross-sectional width of the via 113 is denoted as distance D6 (see FIG. 12A), which corresponds to a diameter of the via 113 in a top-down view (see FIG. 12B). In some embodiments, distance D6 is in the range of about 20 µm to about 45 µm. A cross-sectional width of the via 143 is denoted as distance D7 (see FIG. 12A), which corresponds to a diameter of the via 143 in a top-down view (see FIG. 12B). In some embodiments, distance D7 is in the range of about 20 µm to about 45 µm. In other embodiments distances D1, D2, D6, and D7 may be different.

FIG. 12B illustrates a top-down view of the conductive pad 138A. Locations of the through via 112, the via 113, the through via 142, and the via 143 are illustrated in ghost as dashed lines in FIG. 12B. As illustrated by FIG. 12B, the through via 112 and the through via 142 overlap in a top down view. A maximum distance of overlap between the through via 112 and the through via 142 in a top-down view is denoted as distance D9, which may be in the range of about 10 µm to about 60 µm in some embodiments. In other embodiments distance D9 may be different.

The conductive pad 138A comprises a first region 144A and a second region 144B. The first region 144A is electrically connected to the through via 112 by the via 113, and the second region 144B is electrically connected to the through via 142 by the via 143. The first region 144A may have a round shape (e.g., substantially circular), which is substantially concentric with the through via 112. In some embodiments, the first region 144A completely surrounds the through via 112 in a top-down view. For example, an outer perimeter of the first region 144A may fully encircle the through via 112 in the top down view. In some embodiments, a diameter D3 of the first region 144A may be equal to a diameter of the through via 112 (e.g., distance D1) plus about 40 µm. The second region 144B may have a round shape (e.g., substantially circular), which is substantially concentric with the through via 142. In some embodiments, the second region 144B completely surrounds the through via 142 in a top-down view. For example, an outer perimeter of the second region 144B may fully encircle the through via 142 in the top down view. In some embodiments, a diameter D4 of the second region 144B may be equal to a diameter of the through via 142 (e.g., distance D2) plus about 40 µm. In other embodiments the distances D3 and D4 may be different.

Because the through via 112 and the through via 142 overlap in a top-down view, the first region 144A and the second region 144B may overlap also overlap in a top down view. The overlap between the first region 144A and the second region 144B is denoted as region 144C. In various embodiments, the first region 144A, the second region 144B, and the region 144C provide shielding (e.g., from electromagnetic interference) between the through via 112 and the through via 142.

In the embodiment of FIG. 12B, the through via 112 and the through via 142 carry different electrical signals. For example, a redistribution line 148A is electrically connected to the first region 144A, which is electrically connected to the through via 112. As another example, a redistribution line 148B is electrically connected to the second region 144B, which is electrically connected to the through via 142. Redistribution line 148A provides electrical routing to and form a different area of the package for through via 112, and redistribution line 148B provides electrical routing to and from a different area of the package for through via 142. Because redistribution lines 148A and 148B carry different electrical signals, openings 146C are patterned in the conductive pad 138A to electrically isolate the first region 144A (and redistribution line 148A/through via 112) from the second region 144B (and redistribution line 148B/through via 142). For example, the openings 146C may be filled with a dielectric material of the dielectric layer 140. As such, the openings 146C may also be referred to herein as dielectric regions 146C or insulating regions 146C. In some embodiments, the openings 146C completely encircle region 144C where the regions 144A and 144B overlap. For example, the openings 146C electrically isolate the regions 144A, 144B, and 144C. A width of openings 146C is denoted as D8, which can be in the range of 10 µm to 20 µm in some embodiments. In other embodiments distance D8 may be different.

Openings 146A extend through region 144A, and openings 146B extend through region 144B in order reduce the material density (e.g., metal density) of regions 144A and 144B. The conductive material of regions 144A and 144B may completely encircle respective openings 146A and 146B in a top down view (see FIG. 12B). The openings 146A and 146B extend through the conductive pad 138A and are filled with a dielectric material surrounding the conductive pad 138A (e.g., dielectric layer 140). Thus, the openings 146A and 146B may also be referred to as dielectric regions 146A and 14B, respectively. Each of the openings 144A and 144B may or may not have a same size. For example, a width of each of the openings 144A and 144B is denoted as D5, which may be in the range of 10 µm to 20 µm in some embodiments. In other embodiments distance D5 may be different.

In FIG. 12B, stress induced by the conductive pad 138A on the surrounding material (e.g., dielectric layer 140) is illustrated by arrows 150. For example, the stress may be along a direction extending outward from centers of the regions 144A and 144B. By incorporating the openings 146A and 146B to remove a material of the conductive pad 138A along the direction of stress (e.g., arrows 150), stress induced by the conductive pad 138A may be advantageously reduced. This reduction in stress may further reduce manufacturing defects, such as, peeling, cracking, thermal cycle test failure, and the like. Thus, yield in manufacturing the package may be improved.

Figures 12C, 12D:
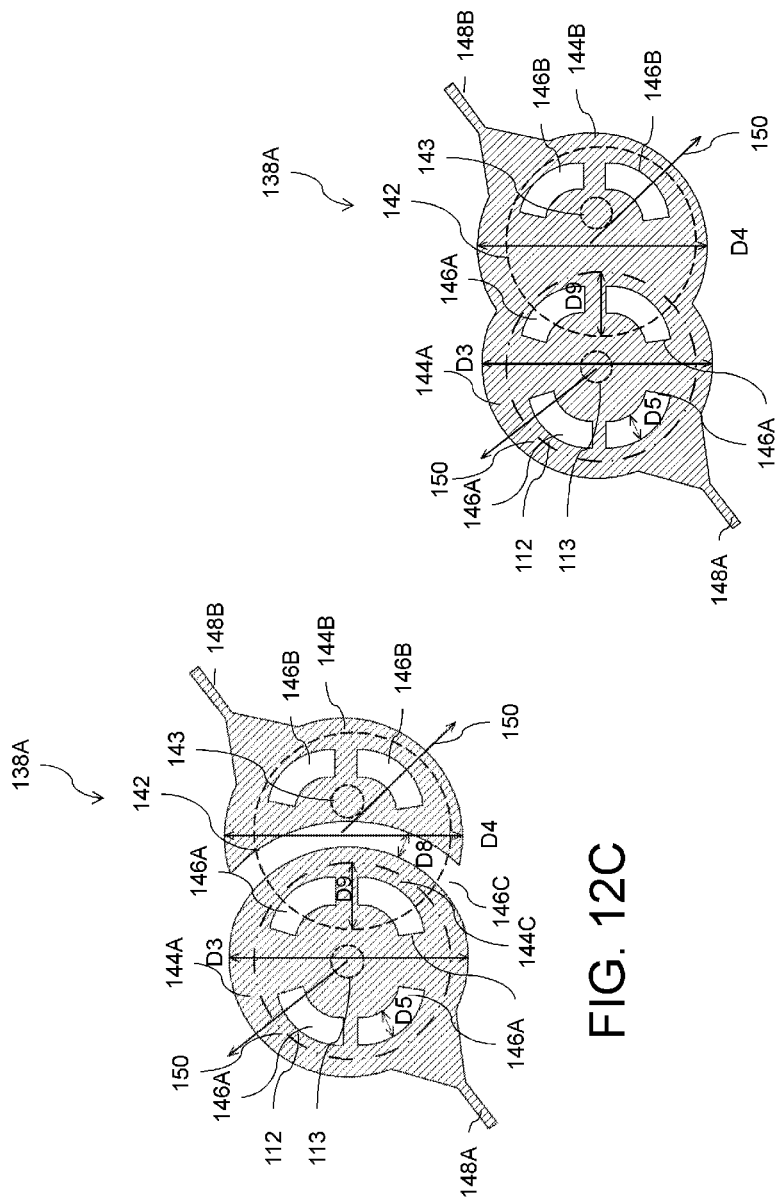

FIG. 12B illustrates one possible configuration for the conductive pad 138A. Other embodiments may include different configurations 138A with a different number of openings 146A, 146B, and/or 146C. For example, FIG. 12C illustrates a top-down view of a conductive pad 138A according to an alternative embodiment. The conductive pad of FIG. 12C may be similar to the conductive pad of FIG. 12B where like reference numerals indicate like elements. For example, the distances D1, D2, D3, D4, D5, D6, D7, D8, and D9 may be similar to the dimensions described above with respect to FIG. 12B. In other embodiments, the distances D1, D2, D3, D4, D5, D6, D7, D8, and D9 are different. Similar to the configuration illustrated in FIG. 12B, the through vias 112 and 142 carry different electrical signals. As illustrated by FIG. 12C, only one opening 146C electrically isolates the first region 144A (and redistribution line 148A/through via 112) from the second region 144B (and redistribution line 148B/through via 142). Region 144C where the first region 144A and the second region 144B overlap may be disposed on one side of the opening 146C. Furthermore, the number of openings 146A in the first region 144A may be different than the number of openings 146B in the second region 144A. For example, the first region 144A may include four openings 146A while the second region 144B only includes two openings 146A.

FIG. 12D illustrates a top-down view of a conductive pad 138A according to an alternative embodiment. The conductive pad of FIG. 12D may be similar to the conductive pad of FIG. 12B where like reference numerals indicate like elements. For example, the distances D1, D2, D3, D4, D5, D6, D7, D8, and D9 may be similar to the dimensions described above with respect to FIG. 12B. In other embodiments, the distances D1, D2, D3, D4, D5, D6, D7, D8, and D9 are different. For example, distance D9 may be 100% of a distance D3 and D4 (e.g., the first region 144A and the second region 144B may completely overlap). Unlike the configurations illustrated in FIGS. 12B and 12B, the through vias 112 and 142 carry a same electrical signal. For example, the through vias 112 and 142 may carry power or ground signals. As illustrated by FIG. 12D, opening 146C are excluded, and the conductive pad 138A electrically connects the first region 144A (and redistribution line 148A/through via 112) and the second region 144B (and redistribution line 148B/through via 142). Furthermore, the number of openings 146A in the first region 144A may be the same or different than the number of openings 146B in the second region 144A. For example, the first region 144A may include four openings 146A while the second region 144B only includes two openings 146A. In other embodiments, each of the regions 144A and 144B may include a different number of the openings 146A and/or the openings 146B.

Although FIGS. 12B, 12C, and 12D illustrate different embodiment configurations for conductive pad 138A, a package may include conductive pads 138A having a combination of different configurations. That is, the configurations of conductive pads 138A illustrated by FIGS. 12B, 12C, and 12D are not mutually exclusive. A single device package may include conductive pads having a same configuration or different configurations. For example, a single device package may include a first conductive pad having a configuration illustrated by FIG. 12A, a second conductive pad having a configuration illustrated by FIG. 12C, and/or a third conductive pad having a configuration illustrated by FIG. 12D.

Figure 13:
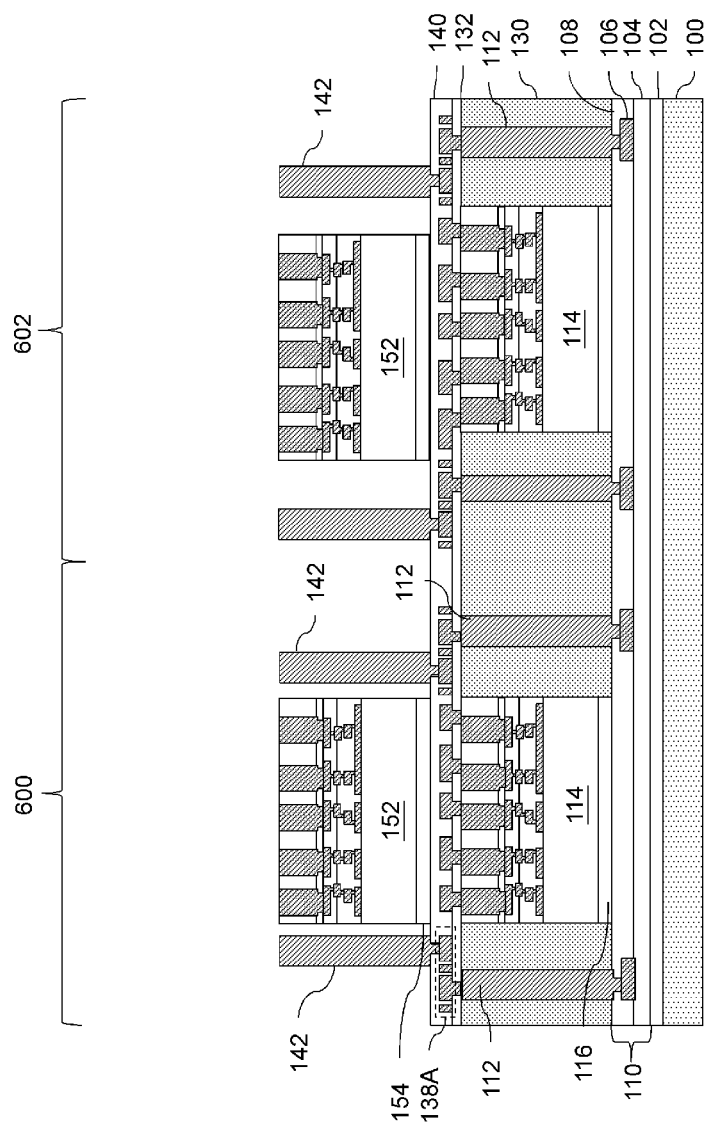

In FIG. 13, integrated circuit dies 152 are adhered to the dielectric layer 140 by an adhesive 154. As illustrated in FIG. 13, one integrated circuit die 152 is adhered in each of the first package region 600 and the second package region 602. In other embodiments, multiple integrated circuit dies 152 may be adhered in each region. The integrated circuit dies 152 may be bare dies, such as, logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 152 may be different sizes (e.g., different heights and/or surface areas), and in other embodiments, the integrated circuit dies 152 may be the same size (e.g., same heights and/or surface areas). In other embodiments, the integrated circuit dies 152 may be packaged devices.

In various embodiments, integrated circuit dies 152 may be similar to the integrated circuit dies 114 and thus, detailed description of the integrated circuit dies 152 is omitted for brevity. Any description of the integrated circuit die 114 contained herein is equally applicable to the integrated circuit dies 152. For example, although illustrated as a bare die, integrated circuit die 152 may be a packaged die. The functionality provided by the integrated circuit dies 114 and 152 may be the same or different depending on package design.

Figure 14:
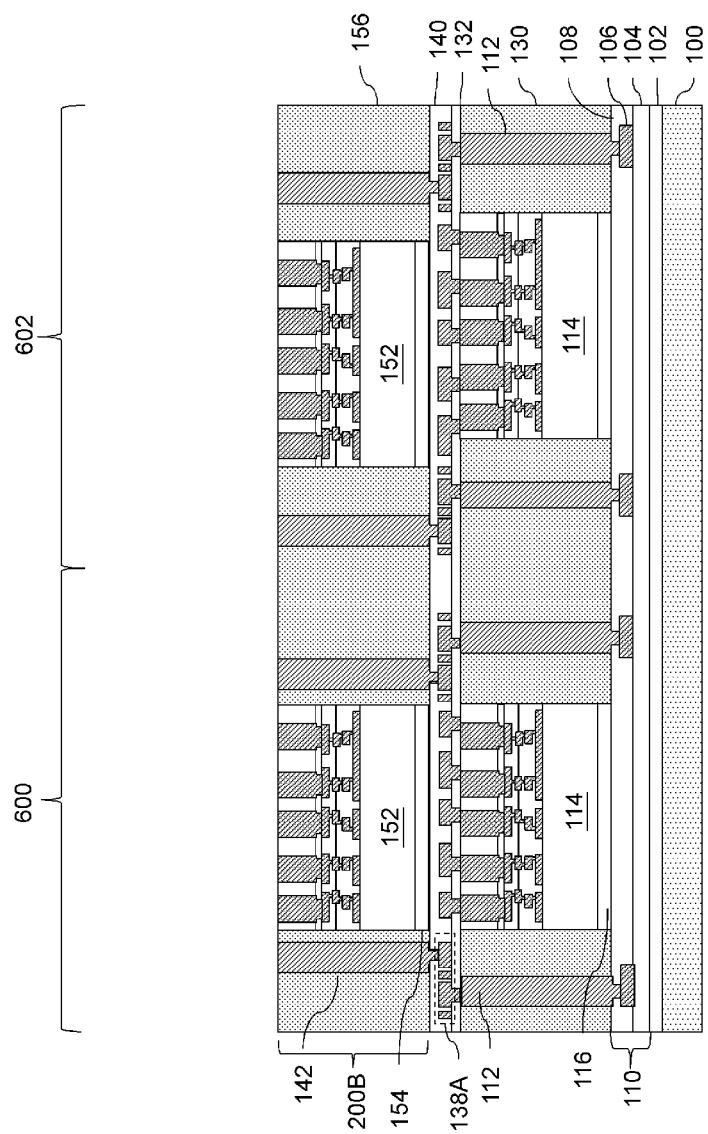

In FIG. 14, an encapsulant 156 is formed on the various components. The encapsulant 156 may be a molding compound, epoxy, or the like, and may be applied by compression molding, transfer molding, or the like. After curing, the encapsulant 156 can undergo a grinding process to expose the through vias 140 and die connectors of the integrated circuit die 152. Top surfaces of the through vias 142, the integrated circuit die 152, and encapsulant 156 are coplanar after the grinding process. In some embodiments, the grinding may be omitted, for example, if through vias 142 and die connectors of integrated circuit die 152 are already exposed. The integrated circuit dies 152 encapsulated in encapsulant 156 and the through vias 142 extending through the encapsulant 156 forms a level 200B (sometimes referred to as tier 200B) of a semiconductor package (e.g., semiconductor package 200, see FIG. 18).

Figure 15:
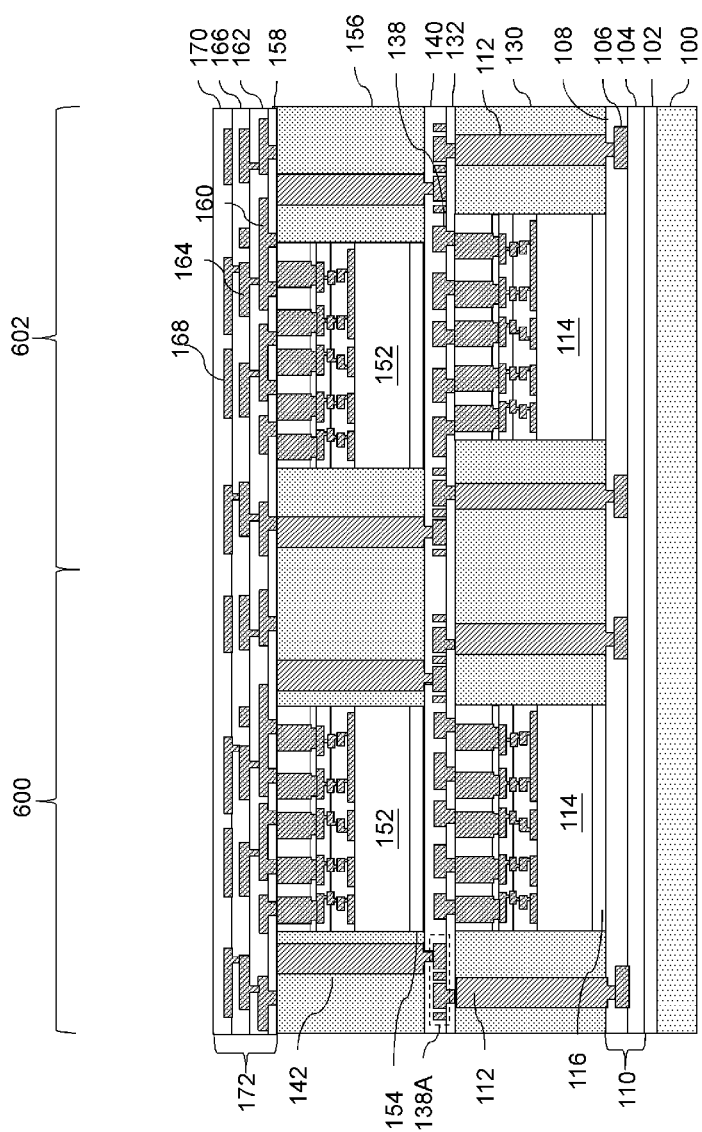

In FIG. 15, a redistribution structure 172 is formed. The redistribution structure 172 includes dielectric layers 158, 162, 166, and 170 and metallization patterns 160, 164, and 168 (sometimes referred to as redistribution layers 160, 164, and 168 or redistribution lines 160, 164, and 168). The dielectric layers 158, 162, 166, and 170 may be deposited and patterned using a similar material/process as discussed above with respect to dielectric layers 132 and 140. Similarly, the metallization patterns 160, 164, and 168 may be formed using a similar material/process as discussed above with respect to the metallization pattern 138. Thus, detailed description of these features is omitted for brevity. The metallization patterns 160, 164, and 168 may be electrically connected to the integrated circuit dies 114, the integrated circuit dies 152, the through vias 142, the metallization pattern 138, and the through vias 112.

The redistribution structure 172 is shown as an example. More or fewer dielectric layers and metallization patterns may be formed in the front-side redistribution structure 172. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Figure 16:
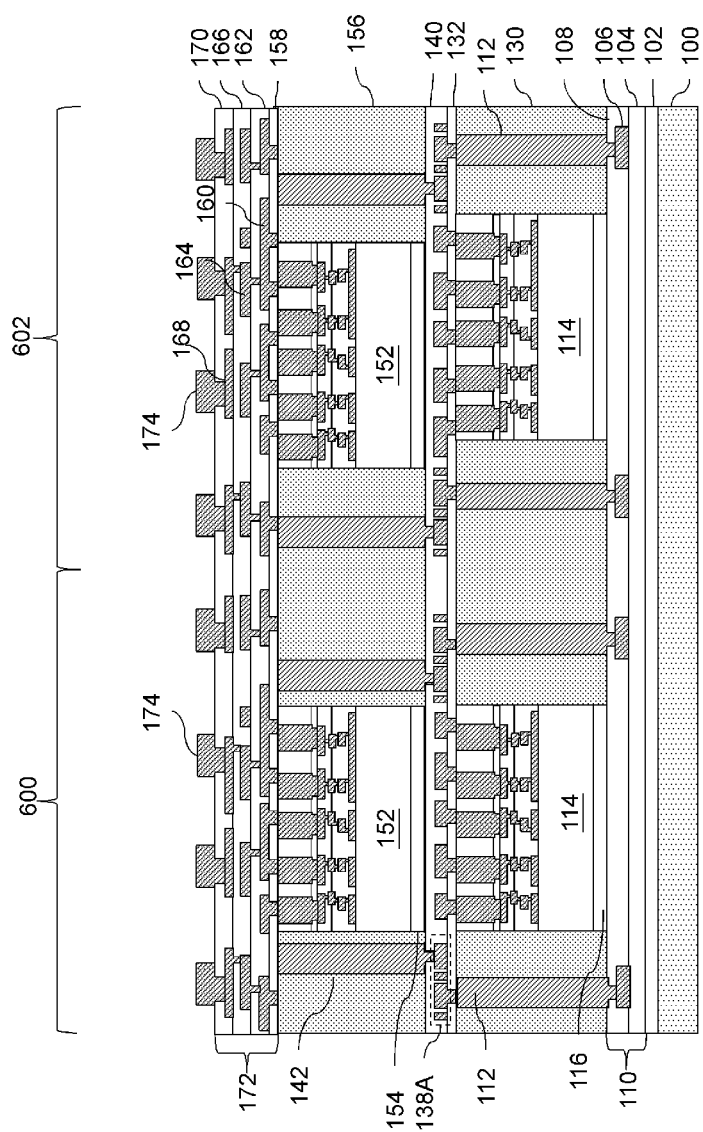

In FIG. 16, pads 174 are formed on an exterior side of the front-side redistribution structure 172. The pads 174 are used to couple to conductive connectors 176 (see FIG. 17) and may be referred to as under bump metallurgies (UBMs) 174. In the illustrated embodiment, the pads 174 are formed through openings through the dielectric layer 170 to the metallization pattern 168. As an example to form the pads 174, a seed layer (not shown) is formed over the dielectric layer 170. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads 174. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 174. In the embodiment, where the pads 174 are formed differently, more photo resist and patterning steps may be utilized.

Figure 17:
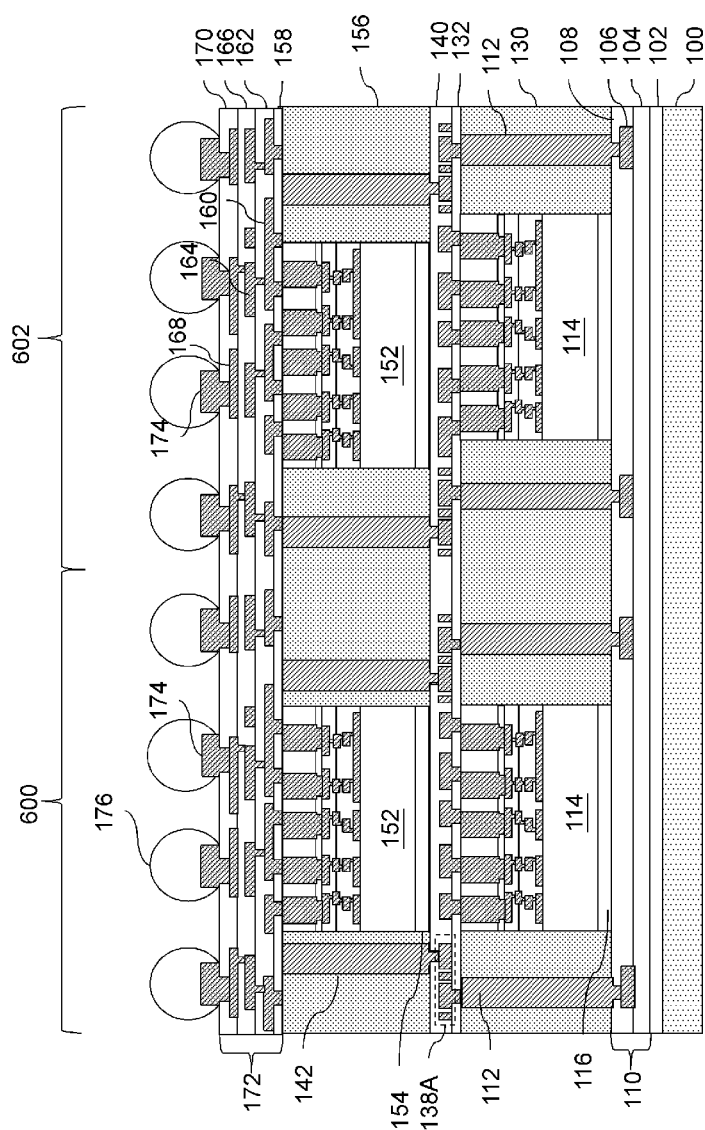

In FIG. 17, conductive connectors 176 are formed on the UBMs 174. The conductive connectors 176 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 176 may include a conductive material such as solder, copper, aluminum, gold, nickel, silver, palladium, tin, the like, or a combination thereof. In some embodiments, the conductive connectors 176 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 176 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 166. The metal cap layer may include nickel, tin, tin-lead, gold, silver, palladium, indium, nickel-palladium-gold, nickel-gold, the like, or a combination thereof and may be formed by a plating process.

Figure 18:
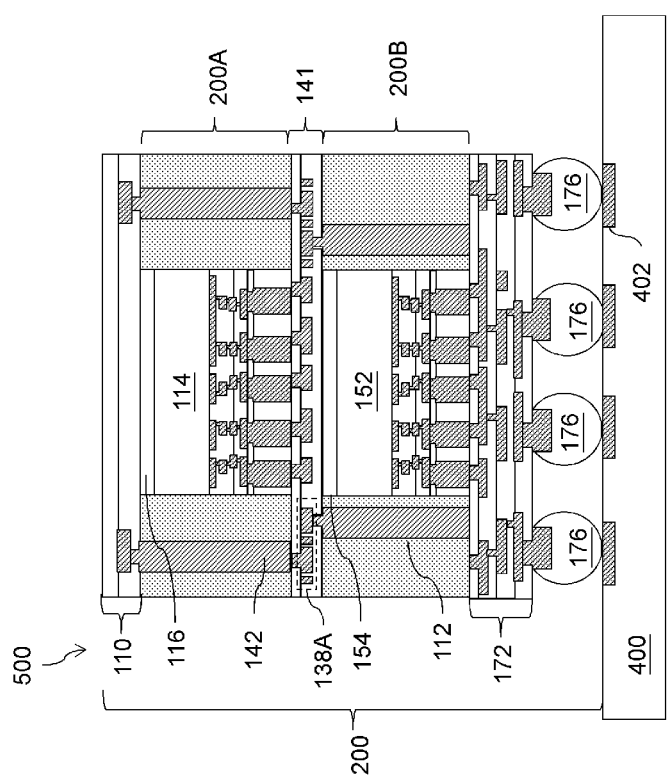

In FIG. 18, a carrier substrate de-bonding is performed to detach (de-bond) the carrier substrate 100 from the backside redistribution structure, e.g., dielectric layer 104. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and bonded to a tape (not shown). A singulation process is performed by sawing along scribe line regions e.g., between adjacent regions 600 and 602. The sawing singulates the first package region 600 from the second package region 602 in order to provide a package component 200.

FIG. 18 illustrates a resulting, singulated package 200, which may be from one of the first package region 600 or the second package region 602. The package 200 may also be referred to as an integrated fan-out (InFO) package 200 having a first level 200A of encapsulated die(s) and through vias 112 and a second level 200B of encapsulated die(s) and through vias 142. A redistribution structure 141 is disposed between and electrically connects components of the first level 200A to components of the second level 200B. The redistribution structure 141 includes metallization pattern 138, which includes conductive pads 138A connecting through vias 114 and 142.

FIG. 18 illustrates a package structure 500 including the package 200 (may be referred to as a first package 200) and a substrate 400. The substrate 400 may be referred to a package substrate 400. The package 200 is mounted to the package substrate 400 using the conductive connectors 176.

The package substrate 400 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 400 may be a SOI substrate. Generally, an SOI substrate includes a layer of a semiconductor material such as epitaxial silicon, germanium, silicon germanium, SOI, SGOI, or combinations thereof. The package substrate 400 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 400.

The package substrate 400 may include active and passive devices (not shown in FIG. 18). As one of ordinary skill in the art will recognize, a wide variety of devices such as transistors, capacitors, resistors, combinations of these, and the like may be used to generate the structural and functional requirements of the design for the semiconductor package 500. The devices may be formed using any suitable methods.

The package substrate 400 may also include metallization layers and vias (not shown) and bond pads 402 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 400 is substantially free of active and passive devices.

In some embodiments, the conductive connectors 176 can be reflowed to attach the package 200 to the bond pads 402. The conductive connectors 176 electrically and/or physically couple the substrate 400, including metallization layers in the substrate 400, to the first package 200. In some embodiments, passive devices (e.g., surface mount devices (SMDs), not illustrated) may be attached to the package 200 (e.g., bonded to the bond pads 402) prior to mounting on the substrate 400. In such embodiments, the passive devices may be bonded to a same surface of the package 200 as the conductive connectors 176.

The conductive connectors 176 may have an epoxy flux (not shown) formed thereon before they are reflowed with at least some of the epoxy portion of the epoxy flux remaining after the package 200 is attached to the substrate 400. This remaining epoxy portion may act as an underfill to reduce stress and protect the joints resulting from the reflowing the conductive connectors 176. In some embodiments, an underfill (not shown) may be formed between the first package 200 and the substrate 400 and surrounding the conductive connectors 176. The underfill may be formed by a capillary flow process after the package 200 is attached or may be formed by a suitable deposition method before the package 200 is attached.

Figure 19:
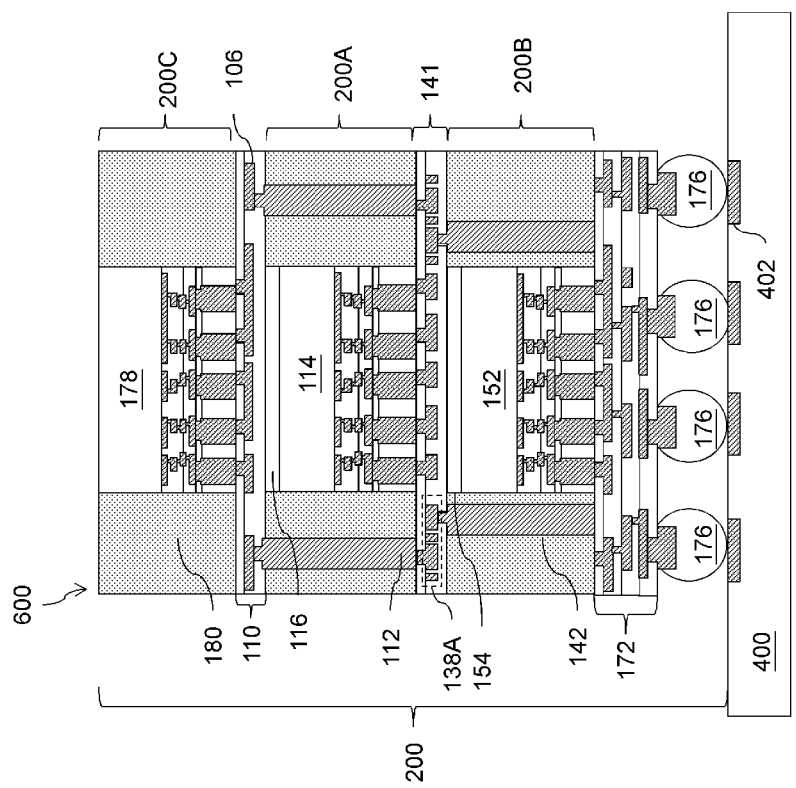
FIG. 19 illustrates a cross-sectional view of a semiconductor device package in accordance with some embodiments.

FIG. 19 illustrates a semiconductor package 600 according to another embodiment. Semiconductor package 600 is similar to semiconductor package 500 where like reference numerals indicate like elements. Package 600 includes an additional level 200C of an encapsulated integrated circuit die (e.g., integrated circuit die 178 encapsulated in encapsulant 180). The integrated circuit die 178 may be substantially similar to the integrated circuit die 114, and any description of the integrated circuit die 114 is equally applicable to the integrated circuit die 178. The integrated circuit die 178 is electrically connected to other components of the semiconductor package 600 (e.g., the integrated circuit dies 114 and 152 and the metallization patterns in the redistribution structures 138A and 172) by metallization patterns 106 in the redistribution structure 110. Level 200C may be substantially free of any through vias extending through the encapsulant 180. Thus, as illustrated in FIG. 19, embodiments contemplate any number of levels of encapsulated integrated circuit dies, and each level may or may not include through vias extending therethrough.

Figure 20:
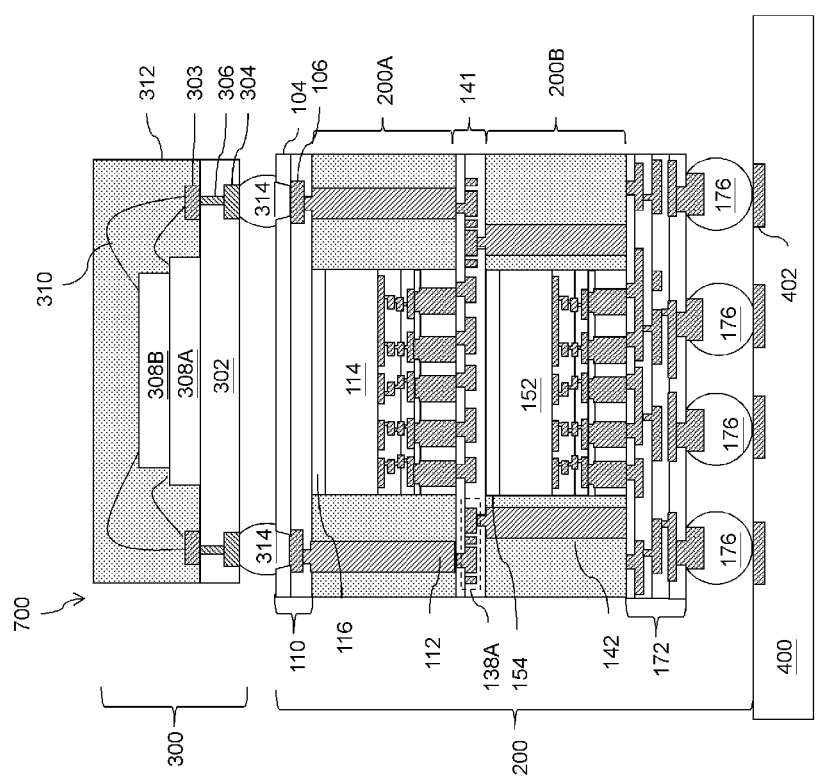
FIG. 20 illustrates a cross-sectional view of a semiconductor device package in accordance with some embodiments.

FIG. 20 illustrates a semiconductor package 700 according to another embodiment. Semiconductor package 600 is similar to semiconductor package 500 where like reference numerals indicate like elements. Package 700 includes semiconductor package component 300 bonded to semiconductor package component 200.

The second package 300 includes a substrate 302 and one or more stacked dies 308 (308A and 308B) coupled to the substrate 302. Although a singular stack of dies 308 (308A and 308B) is illustrated, in other embodiments, a plurality of stacked dies 308 (each having one or more stacked dies) may be disposed side by side coupled to a same surface of the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrate 302 may include active and passive devices (not shown in FIG. 21). As one of ordinary skill in the art will recognize, a wide variety of devices such as transistors, capacitors, resistors, combinations of these, and the like may be used to generate the structural and functional requirements of the design for the semiconductor package 300. The devices may be formed using any suitable methods.

The substrate 302 may also include metallization layers (not shown) and through vias 306. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 303 on a first side the substrate 202 to couple to the stacked dies 308, and bond pads 304 on a second side of the substrate 302, the second side being opposite the first side of the substrate 302, to couple to the functional connectors 314. In some embodiments, the bond pads 303 and 304 are formed by forming recesses (not shown) into dielectric layers (not shown) on the first and second sides of the substrate 302. The recesses may be formed to allow the bond pads 303 and 304 to be embedded into the dielectric layers. In other embodiments, the recesses are omitted as the bond pads 303 and 304 may be formed on the dielectric layer. In some embodiments, the bond pads 303 and 304 include a thin seed layer (not shown) made of copper, titanium, nickel, gold, palladium, the like, or a combination thereof. The conductive material of the bond pads 303 and 304 may be deposited over the thin seed layer. The conductive material may be formed by an electrochemical plating process, an electroless plating process, CVD, ALD, PVD, the like, or a combination thereof. In an embodiment, the conductive material of the bond pads 303 and 304 is copper, tungsten, aluminum, silver, gold, the like, or a combination thereof.

In an embodiment, the bond pads 303 and 304 are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 303 and 304. Any suitable materials or layers of material that may be used for the UBMs 303 and 304 are fully intended to be included within the scope of the current application. In some embodiments, the through vias 306 extend through the substrate 302 and couple at least one bond pad 303 to at least one bond pad 304.

In the illustrated embodiment, the stacked dies 308 are coupled to the substrate 302 by wire bonds 310, although other connections may be used, such as conductive bumps. In an embodiment, the stacked dies 308 are stacked memory dies. For example, the stacked memory dies 308 may include low-power (LP) double data rate (DDR) memory modules, such as LPDDR1, LPDDR2, LPDDR3, LPDDR4, or the like memory modules.

In some embodiments, the stacked dies 308 and the wire bonds 310 may be encapsulated by a molding material 312. The molding material 312 may be molded on the stacked dies 308 and the wire bonds 310, for example, using compression molding. In some embodiments, the molding material 312 is a molding compound, a polymer, an epoxy, silicon oxide filler material, the like, or a combination thereof. A curing step may be performed to cure the molding material 312, wherein the curing may be a thermal curing, a UV curing, the like, or a combination thereof.

In some embodiments, the stacked dies 308 and the wire bonds 310 are buried in the molding material 312, and after the curing of the molding material 312, a planarization step, such as a grinding, is performed to remove excess portions of the molding material 312 and provide a substantially planar surface for the second packages 300.

After the second packages 300 are formed, the packages 300 are mechanically and electrically bonded to the first packages 200 by way of functional connectors 314, the bond pads 304, and the metallization pattern 106. In some embodiments, the metallization pattern 106 may be exposed by patterning the dielectric layer 104 after the carrier 100 is removed. The metallization pattern 106 may be exposed by photolithography and/or etching (e.g., laser etching processes), which may be performed either before or after the semiconductor package component is singulated. Likewise, the second packages 300 may be bonded to the metallization pattern 106 either before or after the semiconductor package component is singulated. In some embodiments, the stacked memory dies 308 may be coupled to the integrated circuit dies 114 through the wire bonds 310, the bond pads 303 and 304, through vias 306, the functional connectors 314, and the through vias 112.

The functional connectors 314 may be similar to the conductive connectors 176 described above and the description is not repeated herein, although the functional connectors 314 and the conductive connectors 176 need not be the same. The functional connectors 314 may be disposed on an opposing side of the substrate 302 as the stacked memory dies 308. In some embodiments, a solder resist 318 may also be formed on the side of the substrate 302 opposing the stacked memory dies 308. The functional connectors 314 may be disposed in openings in the solder resist 318 to be electrically and mechanically coupled to conductive features (e.g., the bond pads 304) in the substrate 302. The solder resist 318 may be used to protect areas of the substrate 302 from external damage.

In some embodiments, before bonding the functional connectors 314, the functional connectors 314 are coated with a flux (not shown), such as a no-clean flux. The functional connectors 314 may be dipped in the flux or the flux may be jetted onto the functional connectors 314. In another embodiment, the flux may be applied to the surfaces of the metallization patterns 106.

In some embodiments, the functional connectors 314 may have an optional epoxy flux (not shown) formed thereon before they are reflowed with at least some of the epoxy portion of the epoxy flux remaining after the second package 300 is attached to the first package 200. This remaining epoxy portion may act as an underfill to reduce stress and protect the joints resulting from the reflowing the functional connectors 314.

The bonding between the second package 300 and the first package 200 may be a solder bonding. In an embodiment, the second package 300 is bonded to the first package 200 by a reflow process. During this reflow process, the functional connectors 314 are in contact with the bond pads 304 and the metallization patterns 106 to physically and electrically couple the second package 300 to the first package 200. After the bonding process, an intermetallic compound (IMC, not shown) may form at the interface of the metallization patterns 106 and the functional connectors 314 and also at the interface between the functional connectors 314 and the bond pads 304 (not shown).

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In some embodiments, the through vias of each level may be oriented so that their locations overlap in a top-down view. A conductive pad is disposed in the redistribution structure between overlapping through vias in order to provide electrical routing to/from the overlapping through vias, to reduce interference between overlapping the through vias, and/or to reduce stress between the overlapping through vias. For example, a conductive pad may be connected to a first through via in a first level (e.g., disposed under the conductive pad) and a second through via in a second level (e.g., disposed over the conductive pad). The conductive pad may electrically isolate or electrically connect the first through via and the second through via.

In some embodiments, the conductive pad is patterned to include openings in a conductive material of the conductive pad. For example, the openings may be filled with an insulating material of the redistribution structure. By reducing the overall density of conductive material (e.g., lower metal density) of the conductive pad, stress caused by the conductive pad itself may be advantageously reduced. Without being bound by a particular theory, reduced metal density of the conductive pad may reduce manufacturing defects such as stress-induced sidewall peeling, thermal cycle test failure, and the like.

In an embodiment, a package includes a first integrated circuit die encapsulated in a first encapsulant; a first through via extending through the first encapsulant; a conductive pad disposed in a dielectric layer over the first through via and the first encapsulant, wherein the conductive pad comprises a first region electrically connected to the first through via and having an outer perimeter encircling an outer perimeter of the first through via in a top down view; and a first dielectric region extending through the first region of the conductive pad, wherein a conductive material of the first region encircles the first dielectric region in the top down view. In an embodiment, the package further includes a second through via over the conductive pad, wherein the first through via and the second through via overlap in the top down view, and wherein the conductive pad further comprises a second region electrically connected to the second through via and having an outer perimeter encircling an outer perimeter of the second through via in the top down view; and a second dielectric region extending through the second region of the conductive pad. conductive material of the second region of the conductive pad encircles the second dielectric region in the top down view. In an embodiment, the package further includes a third dielectric region separating the first region of the conductive pad from the second region of the conductive pad. In an embodiment, the package further includes a second integrated circuit die over the dielectric layer; and a second encapsulant encapsulating the second integrated circuit die. The second through via extends through the second encapsulant. In an embodiment, the first region of the conductive pad overlaps the second region of the conductive pad. In an embodiment, the first region of the conductive pad and the first through via are concentric. In an embodiment, the through via is electrically connected to the first region of the conductive pad by a via extending continuously from the conductive pad to the through via.

In an embodiment, a package includes a first through via extending through a first molding compound; a second through via extending through a second molding compound, wherein the first through via and the second through via overlap in a top down view; and a conductive pad in a dielectric layer between the first molding compound and the second molding compound. The conductive pad includes a first conductive region electrically connected to the first through via, wherein a material of the dielectric layer defines one or more first insulating regions extending through the first conductive region; and a second conductive region electrically connected to the second through via. The material of the dielectric layer further defines one or more second insulating regions extending through the second conductive region. In an embodiment, the material of the dielectric layer defines a third insulating region extending through the conductive pad, wherein the third insulating region electrically isolates the first through via from the second through via. In an embodiment, the conductive pad electrically connects the first through via to the second through via. In an embodiment, a total number of the one or more first insulating regions in the first conductive region is equal to a total number of the one or more second insulating regions in the second conductive region. In an embodiment, a total number of the one or more first insulating regions in the first conductive region is different than a total number of the one or more second insulating regions in the second conductive region. In an embodiment, the first conductive region electrically connects the first through via to a redistribution line, and the redistribution line is disposed on an opposing side of one of the one or more first insulating regions than the through via in the top down view. In an embodiment, a third conductive region is defined by an overlap between the first conductive region and the second conductive region, and the third conductive region is electrically isolated from the first through via. In an embodiment, the third conductive region is further electrically isolated from the second through via. In an embodiment, the first conductive region completely encircles the first through via in the top down view, and the second conductive region completely encircles the second through via in the top down view.

In an embodiment, a method includes encapsulating a first semiconductor die and a first through via in a first encapsulant; forming a conductive pad over the first through via. The conductive pad includes a first region electrically connected to the first through via, wherein the first region overlaps and is larger than the first through via in a top down view and a first opening extending through the first region. The method further includes depositing a dielectric layer over the conductive pad, wherein depositing the dielectric layer comprises filling the first opening with a dielectric material of the dielectric layer. In an embodiment, the method further includes forming a second through via over the conductive pad. In an embodiment, the conductive pad further includes a second region electrically connected to the second through via, wherein the second region overlaps and is larger than the second through via in the top down view; and a second opening extending through the second region, wherein depositing the dielectric layer comprises filling the second opening with the dielectric material of the dielectric layer. In an embodiment, the first through via and the second through via at least partially overlap in the top down view. In an embodiment, the method further includes encapsulating the second through via and a second semiconductor die in a second encapsulant.

In an embodiment, a package includes a first level having a first semiconductor die encapsulated in a first molding compound; and a first conductive via extending through the first molding compound. In an embodiment, the package further includes a second level having a second semiconductor die encapsulated in a second molding compound and a second conductive via extending through the second molding compound. An embodiment, the package further includes a conductive pad between the first level and the second level, the conductive pad having a first conductive region electrically connecting the first conductive via to a first redistribution line; and a second conductive region electrically connecting the second conductive via to a second redistribution line, wherein the first conductive region and the second conductive region overlap in a top down view; a first dielectric region extending through the first conductive region of the conductive pad; and a second dielectric region extending through the second conductive region of the conductive pad. In an embodiment, an outer perimeter of the first through via is disposed fully within an outer perimeter of the first conductive region in the top down view, and an outer perimeter of the second through via is disposed fully within an outer perimeter of the second conductive region in the top down view. In an embodiment, the first dielectric region is disposed between a center of the first conductive region and first redistribution line in the top down view.

In an embodiment, a method includes encapsulating a first through via and a first semiconductor die in a first encapsulant; encapsulating a second through via and a second semiconductor die in a second encapsulant, wherein the first through via and the second through via overlap in a top down view; and forming a conductive pad between the first through via and the second through via. In an embodiment, the conductive pad includes a first conductive region electrically connected to the first through via; a first opening extending through the first conductive region; a second conductive region electrically connected to the second conductive via; and a second opening extending through the second conductive region. In an embodiment, the method further includes depositing a dielectric layer around the conductive pad and in the first opening and the second opening. In an embodiment, the conductive pad further comprises a third opening electrically isolating at least a portion of the first conductive region from at least a portion of the second conductive region. In an embodiment, depositing the dielectric layer comprises depositing the dielectric layer in the third opening. In an embodiment, the conductive pad electrically connects the first conductive region to the second conductive region. In an embodiment, forming the conductive pad includes depositing a seed layer; using a mask to define a shape of the conductive pad; and electroplating the conductive pad in openings of the mask.

In an embodiment, a method includes encapsulating a first semiconductor die and a first conductive via in a first encapsulant; forming a conductive pad over the first conductive via, wherein the conductive pad comprises: a first region electrically connected to the first conductive via, wherein an outer perimeter of the first region fully encircles an outer perimeter of the first conductive via in a top down view; and a first opening extending through the first region; depositing a dielectric layer around the conductive pad and in the first opening; patterning a second opening in the dielectric layer to expose a second region of the conductive pad; and forming a second conductive via extending through the second opening and above the dielectric layer. In an embodiment, the method further includes disposing a second semiconductor die over the dielectric layer adjacent the second conductive via; and encapsulating the second semiconductor die and the second conductive via in a second encapsulant. In an embodiment, the conductive pad extends laterally past the outer perimeter of the first conductive via and an outer perimeter of the second conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   encapsulating a first semiconductor die and a first through via in a first encapsulant;
   forming a conductive pad over the first through via, wherein the conductive pad comprises:
   a first region electrically connected to the first through via, wherein the first region overlaps and is larger than the first through via in a top down view; and
   a first opening extending through the first region; and
   depositing a dielectric layer over the conductive pad, wherein depositing the dielectric layer comprises filling the first opening with a dielectric material of the dielectric layer.

2. The method of claim 1 further comprising:
forming a second through via over the conductive pad, wherein the conductive pad further comprises:
a second region electrically connected to the second through via, wherein the second region overlaps and is larger than the second through via in the top down view; and
a second opening extending through the second region, wherein depositing the dielectric layer comprises filling the second opening with the dielectric material of the dielectric layer.

3. The method of claim 2, wherein the first through via and the second through via at least partially overlap in the top down view.

4. The method of claim 2 further comprising encapsulating the second through via and a second semiconductor die in a second encapsulant.

5. The method of claim 4 further comprising encapsulating a second semiconductor die in the second encapsulant.

6. The method of claim 2, wherein the second region is electrically connected to the first region.

7. The method of claim 2, wherein the second region is electrically isolated from the first region.

8. A method comprising:
dispensing a molding compound around a first through via;
depositing a first insulating layer over the molding compound and the first through via;
plating a conductive pad over the first insulating layer, wherein the conductive pad is electrically connected to the first through via by a first conductive via extending through the first insulating layer, wherein the conductive pad overlaps and extends beyond an outer perimeter of the first through via in a top down view, and wherein a plurality of openings extend through the conductive pad;
depositing a second insulating layer over the conductive pad and in the plurality of openings; and
plating a second through via over the second insulating layer, wherein the conductive pad electrically connects the first through via to the second through via.

9. The method of claim 8, wherein depositing the molding compound comprises depositing the molding compound around a first integrated circuit die.

10. The method of claim 8, further comprising plating a second via extending through an upper portion of the second insulating layer, the second via electrically connecting the conductive pad to the second through via.

11. The method of claim 10, wherein a first one of the plurality of openings is disposed between a first interface and a second interface, the first interface is between the conductive pad and the first conductive via, and the second interface is between the conductive pad and the second via.

12. The method of claim 8, wherein a width of each of the plurality of openings is in a range of 10 μm to 20 μm.

13. The method of claim 8, wherein the first through via and the second through via overlap in a top down view.

14. The method of claim 13, wherein a second one of the plurality of openings overlaps the first through via and the second through via in the top down view.

15. A package comprising:
a first integrated circuit die and a first through via in a first molding compound;
a second integrated circuit die and a second through via in a second molding compound;
a conductive pad between the first molding compound and the second molding compound, wherein the conductive pad is electrically connected to the first through via and the second through via, and wherein the conductive pad overlaps the first through via and the second through via in a top down view; and
a first dielectric region extending through the conductive pad, wherein the conductive pad completely encircles the first dielectric region in a top down view.

16. The package of claim 15, wherein the conductive pad is disposed in an insulating layer, and wherein the insulating layer has a same material composition as the first dielectric region.

17. The package of claim 15, wherein the first through via overlaps the second through via in a top down view.

18. The package of claim 15, wherein the conductive pad further electrically connects the first through via to a first redistribution line.

19. The package of claim 15 further comprising a redistribution structure on an opposing side of the second integrated circuit die as the conductive pad.

20. The package of claim 15, wherein the conductive pad extends beyond lateral extents of the first through via in the top down view.

* * * * *